United States Patent
Mahurin et al.

(10) Patent No.: US 11,287,872 B2
(45) Date of Patent: Mar. 29, 2022

(54) MULTI-THREAD POWER LIMITING VIA SHARED LIMIT

(71) Applicant: QUALCOMM Incorporated, San Diego, CA (US)

(72) Inventors: Eric Wayne Mahurin, Austin, TX (US); Vijay Kiran Kalyanam, Austin, TX (US)

(73) Assignee: Qualcomm Incorporated, San Diego, CA (US)

(*) Notice: Subject to any disclaimer, the term of this patent is extended or adjusted under 35 U.S.C. 154(b) by 129 days.

(21) Appl. No.: 16/829,942

(22) Filed: Mar. 25, 2020

(65) Prior Publication Data

US 2021/0240251 A1  Aug. 5, 2021

Related U.S. Application Data

(60) Provisional application No. 62/969,973, filed on Feb. 4, 2020.

(51) Int. Cl.
| | | |
|---|---|---|
| G06F 1/32 | (2019.01) | |
| G06F 1/3287 | (2019.01) | |
| H03H 17/04 | (2006.01) | |
| G01R 21/133 | (2006.01) | |

(52) U.S. Cl.
CPC ......... *G06F 1/3287* (2013.01); *G01R 21/133* (2013.01); *H03H 17/04* (2013.01)

(58) Field of Classification Search
CPC ...................................................... G06F 1/32
See application file for complete search history.

(56) References Cited

U.S. PATENT DOCUMENTS

| | | | |
|---|---|---|---|
| 2012/0192195 A1* | 7/2012 | El-Moursy | G06F 9/4893 718/103 |
| 2015/0067693 A1* | 3/2015 | Yamazaki | G06F 9/46 718/103 |
| 2015/0177762 A1* | 6/2015 | Ditlow | G06Q 50/06 700/286 |
| 2017/0228007 A1* | 8/2017 | Carlson | G06F 1/3243 |

* cited by examiner

*Primary Examiner* — Paul B Yanchus, III
(74) *Attorney, Agent, or Firm* — Withrow & Terranova, PLLC

(57) ABSTRACT

Systems and methods for multi-thread power limiting via a shared limit estimates power consumed in a processing core on a thread-by-thread basis by counting how many power events occur in each thread. Power consumed by each thread is approximated based on the number of power events that have occurred. Power consumed by individual threads is compared to a shared power limit derived from a sum of the power consumed by all threads. Threads that are above the shared power limit are stalled while threads below the shared power limit are allowed to continue without throttling. In this fashion, the most power intensive threads are throttled to stay below the shared power limit while still maintaining performance.

19 Claims, 16 Drawing Sheets

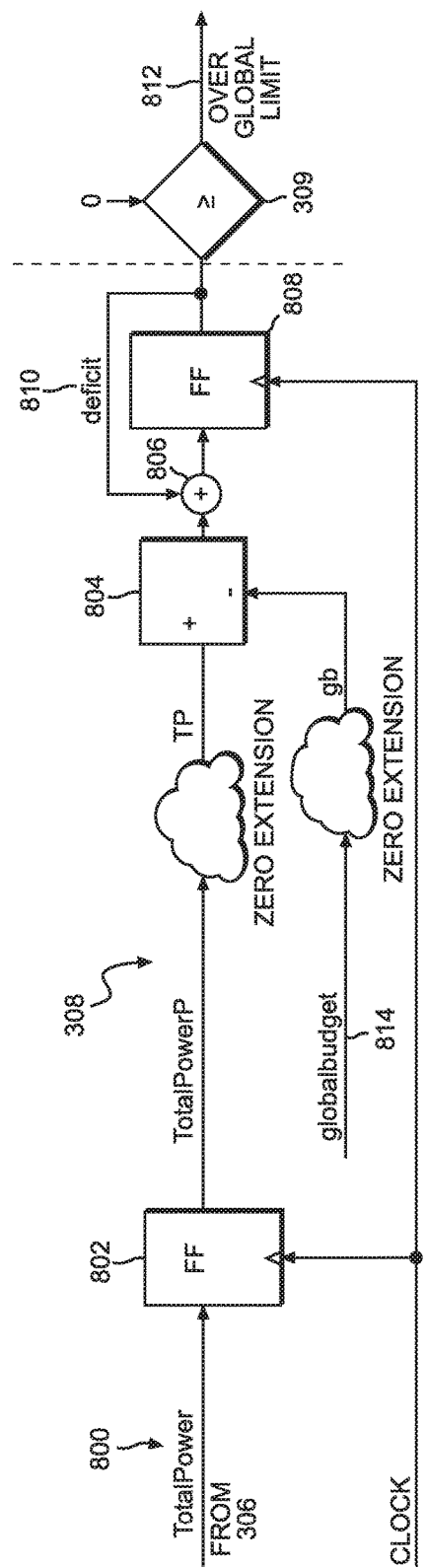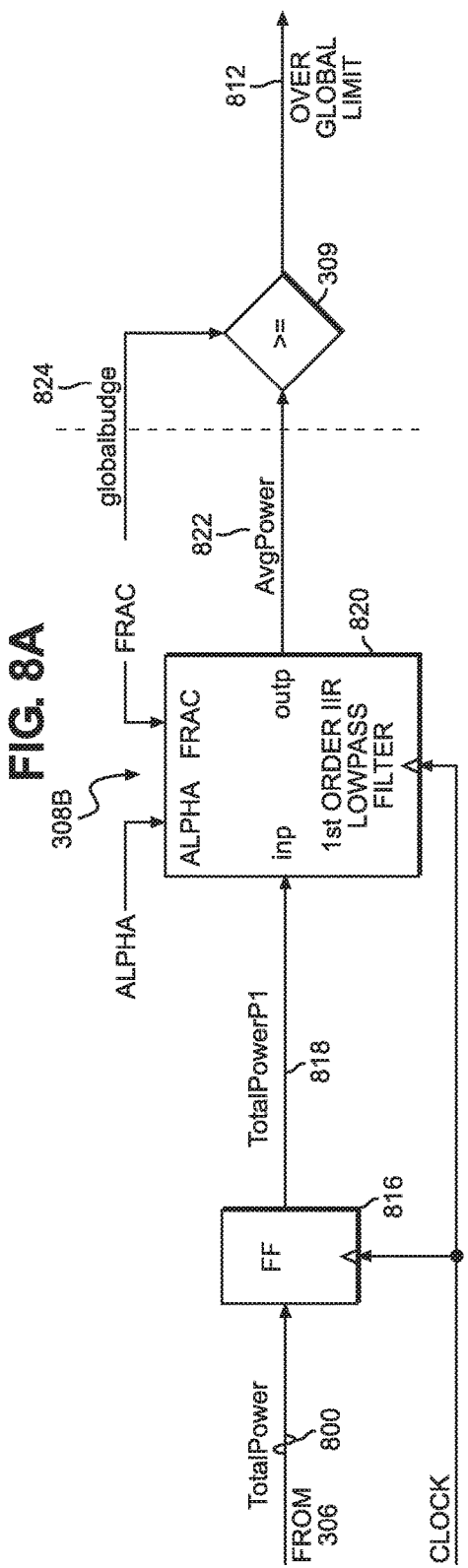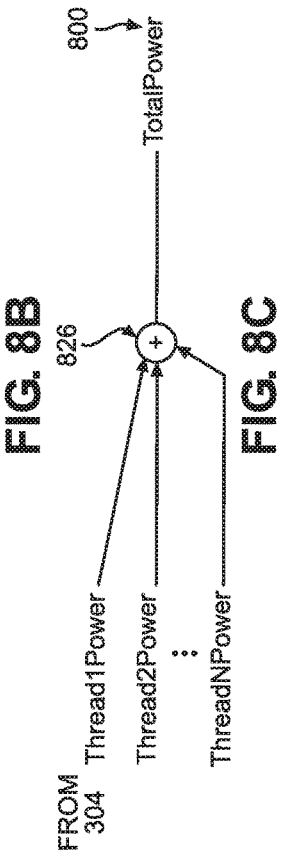
FIG. 8A
FIG. 8B
FIG. 8C

MULTI-THREAD POWER LIMITING VIA SHARED LIMIT

PRIORITY APPLICATION

The present application claims priority to U.S. Provisional Patent Application Ser. No. 62/969,973, filed Feb. 4, 2020 and entitled "MULTI-THREAD POWER LIMITING VIA SHARED LIMIT," which is incorporated herein by reference in its entirety.

BACKGROUND

I. Field of the Disclosure

The technology of the disclosure relates generally to limiting power consumption in a multi-threaded processor.

II. Background

Computing devices have become increasingly popular in part due to ever increasing functionality. Such increased functionality comes from increasingly powerful integrated circuits (ICs) having increasingly powerful processing capabilities. These ICs operate at increasingly high frequencies with more internal transistors, which in turn, consume more power than earlier ICs. An additional reason for increased popularity of computing devices is a growth in the availability of mobile computing devices. Such mobile computing devices typically rely on a battery for power. Batteries effectively have maximum current values that can be provided to the ICs in the mobile computing devices. Excess current levels may result in undesired thermal activity in the computing device.

While existing computing devices have struck a balance that allows desired performance without compromising heat dissipation or performance, new generations of ICs are imposing ever greater demands on the power control circuits. Traditionally, processing system hardware or software is usually constrained by global mechanisms such as limiting clock frequency and/or operating at low voltage modes. Both of these techniques may result in performance loss including unacceptable latency. Accordingly, there is room for new power management methods that result in power demand reduction.

SUMMARY OF THE DISCLOSURE

Aspects disclosed in the detailed description include systems and methods for multi-thread power limiting via a shared limit. In particular, exemplary aspects of the present disclosure estimate power consumed in a processing core on a thread-by-thread basis by counting how many power events occur in each thread. Power consumed by each thread is approximated based on the number of power events that have occurred. Power consumed by individual threads is compared to a shared power limit derived from a sum of the power consumed by all threads. Threads that are above the shared power limit are stalled while threads below the shared power limit are allowed to continue without throttling. In this fashion, the most power intensive threads are throttled to stay below the shared power limit while still maintaining performance.

In this regard in one aspect, a method for controlling power consumption in a computing device is disclosed. The method includes measuring power on a thread-by-thread basis for a plurality of threads at a plurality of thread execution circuits in the computing device. The method also includes calculating a total power consumed by all threads of the plurality of threads. The method also includes generating a shared power limit based on the total power and a predefined limit. The method also includes comparing a value associated with power consumed by an individual thread of the plurality of threads to the shared power limit. The method also includes, when the power consumed by the individual thread exceeds the shared power limit, stalling the individual thread at the plurality of thread execution circuits.

In another aspect, a method for controlling power consumption in a computing device is disclosed. The method includes measuring power on a core-by-core basis for a plurality of processing cores in the computing device. The method also includes calculating a total power consumed by all processing cores. The method also includes generating a shared power limit based on the total power and a predefined limit. The method also includes comparing a value associated with power consumed by an individual processing core of the plurality of processing cores to the shared power limit. The method also includes, when the power consumed by the individual processing core exceeds the shared power limit, stalling the individual processing core.

In another aspect, an integrated circuit (IC) is disclosed. The IC includes a multi-thread processing core. The multi-thread processing core includes a thread logic. The multi-thread processing core also includes a plurality of digital power meters configured to measure power on a thread-by-thread basis at the thread logic. The multi-thread processing core also includes a summation circuit configured to sum outputs from the plurality of digital power meters. The multi-thread processing core also includes a first comparator configured to compare an output of the summation circuit to a predefined limit. The multi-thread processing core also includes a second comparator configured to compare an output of a digital power meter of the plurality of digital power meters to a shared power limit derived from an output of the first comparator.

In another aspect, an IC is disclosed. The IC includes a multi-thread processing core. The multi-thread processing core includes a plurality of thread execution circuits. The multi-thread processing core also includes a plurality of digital power meters configured to measure power on a thread-by-thread basis at a corresponding thread execution circuit. The multi-thread processing core also includes a summation circuit configured to sum outputs from the plurality of digital power meters. The multi-thread processing core also includes a manipulation circuit configured to operate on the sum. The multi-thread processing core also includes a first comparator configured to compare an output of the manipulation circuit to a predefined limit. The multi-thread processing core also includes a multiplexor configured to use the compare result from the first comparator to select a minimum limit or a maximum limit. The multi-thread processing core also includes a circuit that uses a multiplexor output to generate a shared power limit. The multi-thread processing core also includes a second comparator configured to compare an output of a digital power meter of the plurality of digital power meters to the shared power limit.

BRIEF DESCRIPTION OF THE FIGURES

FIGS. 8A and 8B are circuit diagrams showing exemplary implementations of the sum of total power generation, delta accumulator circuit, averaging circuit and comparison circuits of FIGS. 3A and 3B;

FIG. 8C is a simplified schematic diagram of a summation circuit that calculates a total power used by the comparison circuits of FIGS. 8A and 8B;

DETAILED DESCRIPTION

Figure 1A:
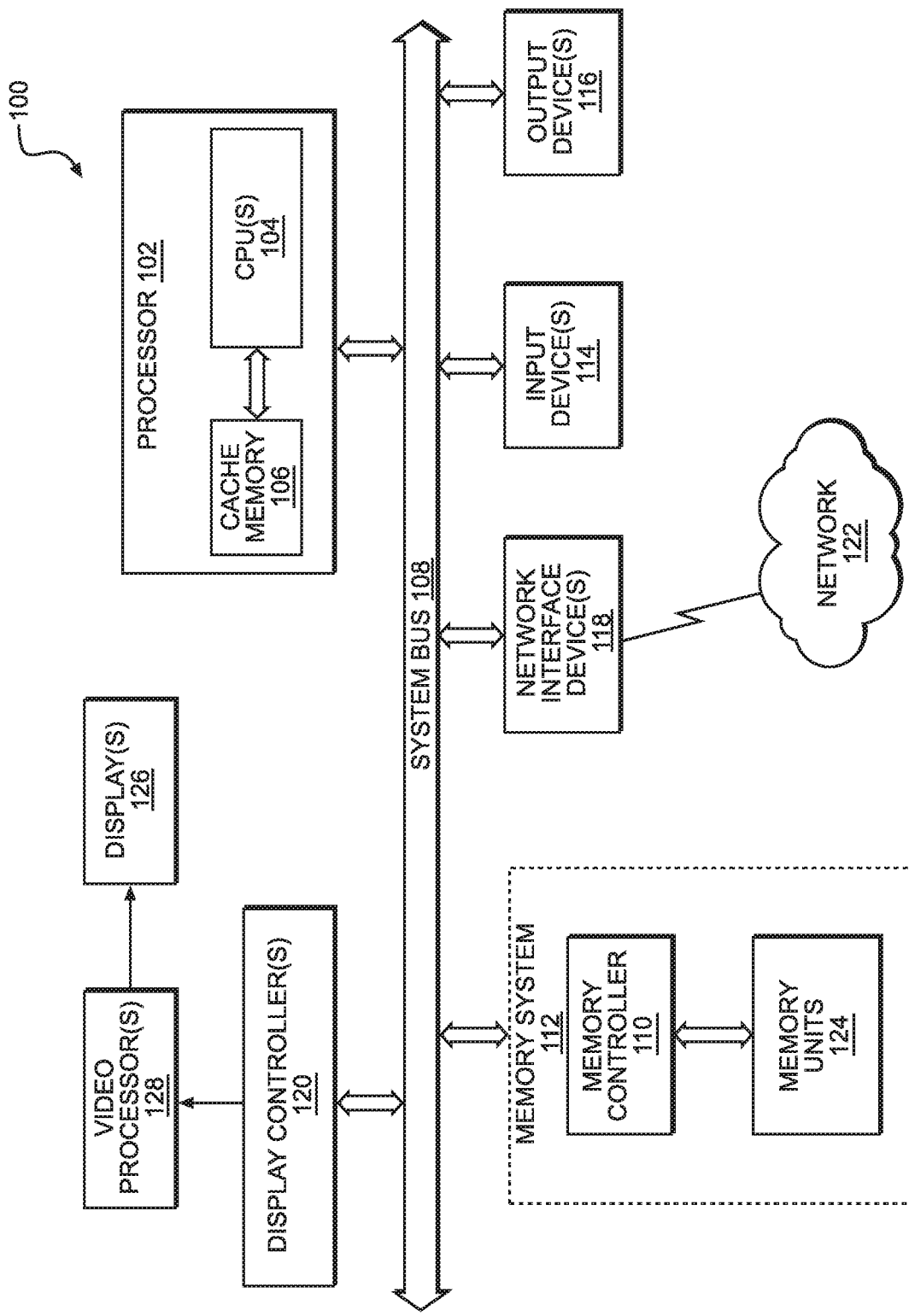
FIG. 1A is a block diagram of an exemplary computing system having one or more processing cores which may implement thread throttling aspects of the present disclosure.

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Aspects disclosed in the detailed description include systems and methods for multi-thread power limiting via a shared limit. In particular, exemplary aspects of the present disclosure estimate power consumed in a processing core on a thread-by-thread basis by counting how many power events occur in each thread. Power consumed by each thread is approximated based on the number of power events that have occurred. Power consumed by individual threads is compared to a shared power limit derived from a sum of the power consumed by all threads. Threads that are above the shared power limit are stalled while threads below the shared power limit are allowed to continue without throttling. In this fashion, the most power intensive threads are throttled to stay below the shared power limit while still maintaining performance.

More particularly, events at a thread logic having multiple thread execution circuits may be counted by digital power meters. That is, each thread may have its events counted by a respective digital power meter. This count is used to approximate an amount of power consumed by the thread. This approximated power is used by a comparison circuit as described below. Additionally, the approximated power for each thread is summed with the power consumed by other threads to a total and manipulated to determine a shared power limit. In a first exemplary aspect, an average power may be calculated from the sum and compared to a configurable total limit to determine the shared power limit. In a second exemplary aspect, an accumulated difference may be calculated from the sum and compared to a configurable total limit to determine the shared power limit. Threads whose event counts exceed the shared power limit are throttled via stall while threads whose event counts are below the shared power limit are allowed to continue without throttling (i.e., no stall). In this approach, the highest power consuming threads are throttled first to stay within the shared power limit while still maintaining performance of other threads that are already within shared power limit.

The present disclosure is well suited for use in any processor that handles multiple threads concurrently. Likewise, the present disclosure may be used at other hierarchical levels such as to throttle different cores in a multi-core processor or different processor chips within a multiple processor computing device. Before addressing these latter aspects, a discussion of exemplary aspects as applied to a computing device having a processor that handles multiple threads concurrently is discussed.

In this regard, FIG. 1A is block diagram of a computing device 100 having a processor 102 therein. The processor 102 includes one or more central processing units (CPUs) 104. The processor 102 may have a cache memory system 106 coupled to the CPU(s) 104 for rapid access to temporarily stored data. The processor 102 is coupled to a system bus 108 and can intercouple devices included in the computing device 100. As is well known, the processor 102 communicates with these other devices by exchanging address, control, and data information over the system bus 108. For example, the processor 102 can communicate bus transaction requests to a memory controller 110 within a memory system 112.

Other devices can be connected to the system bus 108. As illustrated in FIG. 1, these devices can include the memory system 112, one or more input devices 114, one or more output devices 116, one or more network interface devices 118, and one or more display controllers 120, as examples. The input device(s) 114 can include any type of input device, including, but not limited to, input keys, switches, voice processors, etc. The output device(s) 116 can include any type of output device, including, but not limited to, audio, video, other visual indicators, etc. The network interface device(s) 118 can be any devices configured to allow exchange of data to and from a network 122. The network 122 can be any type of network, including, but not limited to, a wired or wireless network, a private or public network, a local area network (LAN), a wireless local area network (WLAN), a wide area network (WAN), a BLUETOOTH™ network, and the Internet. The network interface device(s) 118 can be configured to support any type of communications protocol desired. The memory system 112 can include the memory controller 110 and a memory array 124, which may be dynamic random access memory (DRAM). The processor 102 may also be configured to access the display controller(s) 120 over the system bus 108 to control information sent to one or more displays 126. The display controller(s) 120 sends information to the display(s) 126 to be displayed via one or more video processors 128, which process the information to be displayed into a format suitable for the display(s) 126. The display(s) 126 can include any type of display, including, but not limited to, a liquid crystal display (LCD), a plasma display, a light emitting diode (LED) display, etc.

Figure 1B:
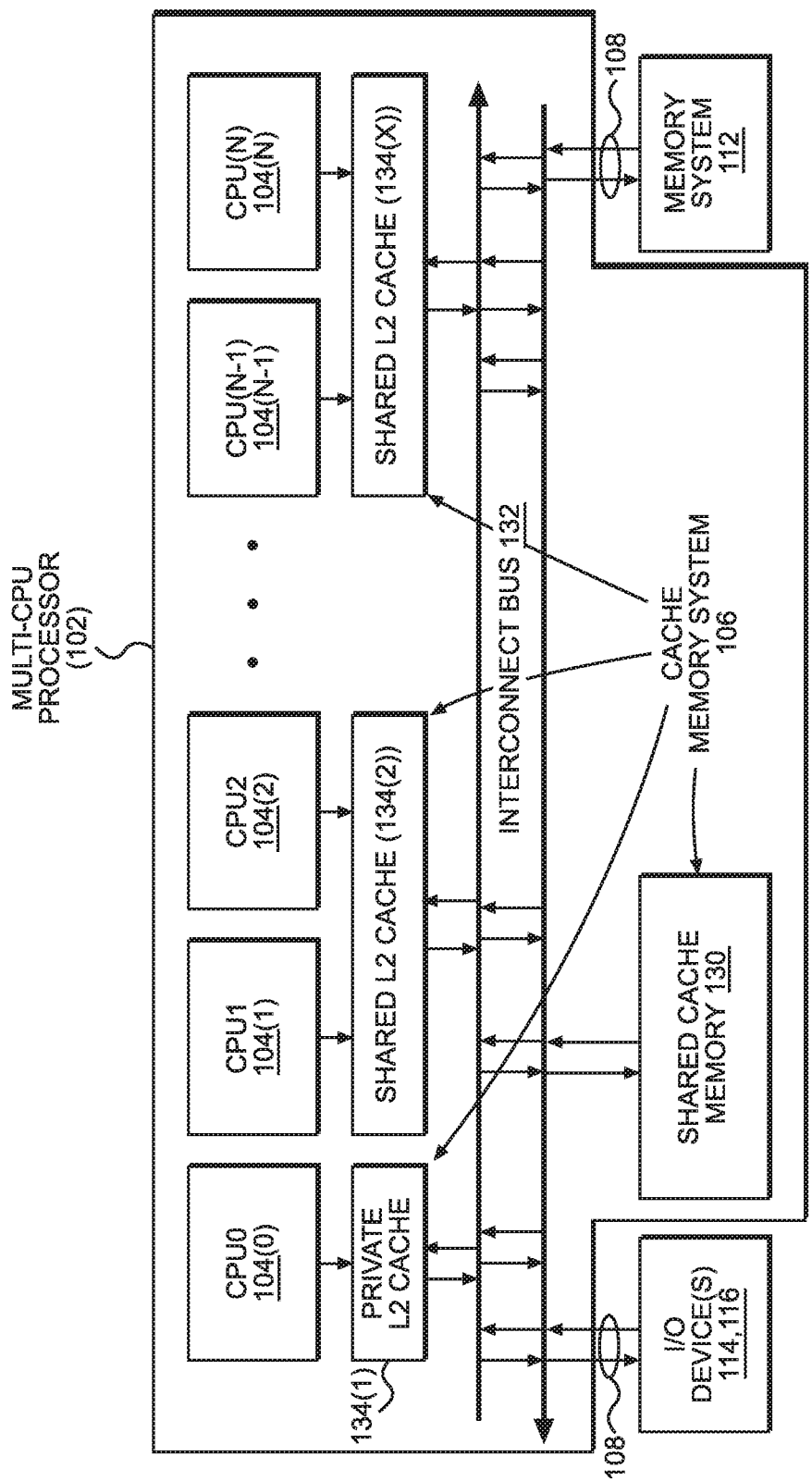
FIG. 1B is a block diagram of a processor of the computing device of FIG. 1A having multiple processing cores therein.

FIG. 1B provides a more detailed block diagram of the processor 102, and particularly contemplates that the processor 102 may include a plurality of CPUs 104(1)-104(N). The cache memory system 106 of FIG. 1A is a hierarchical memory system, as an example, and CPU 104(0) includes a private local cache memory 134(1), which may be a Level 2 (L2) cache memory. CPUs 104(1), 104(2) and CPUs 104(N−1), 104(N) are configured to interface with respective local shared cache memories 134(2)-134(X)), which may also be L2 cache memories for example. If a data read request requested by a CPU 104(0)-104(N) results in a cache miss to the respective cache memories 134(1)-134(X), the read request may be communicated to a next level cache memory, which in this example is a shared cache memory 130. The shared cache memory 130 may be a Level 3 (L3) cache memory as an example. The cache memory 134(1)-134(X) and the shared cache memory 130 are part of the cache memory system 106 of FIG. 1A. That is, the cache memory system 106 of FIG. 1A may be a distributed system with multiple elements in the multi-CPU processor 102. An internal interconnect bus 132, which may be a coherent bus, is provided that allows each of the CPUs 104(0)-104(N) to access respective elements of the cache memory system 106, and the system bus 108. Other shared resources that can be accessed by the CPUs 104(0)-104(N) through the interconnect bus 132 and the system bus 108 can include the input/output (I/O) devices 114/116 and the memory system 112.

Figure 2:
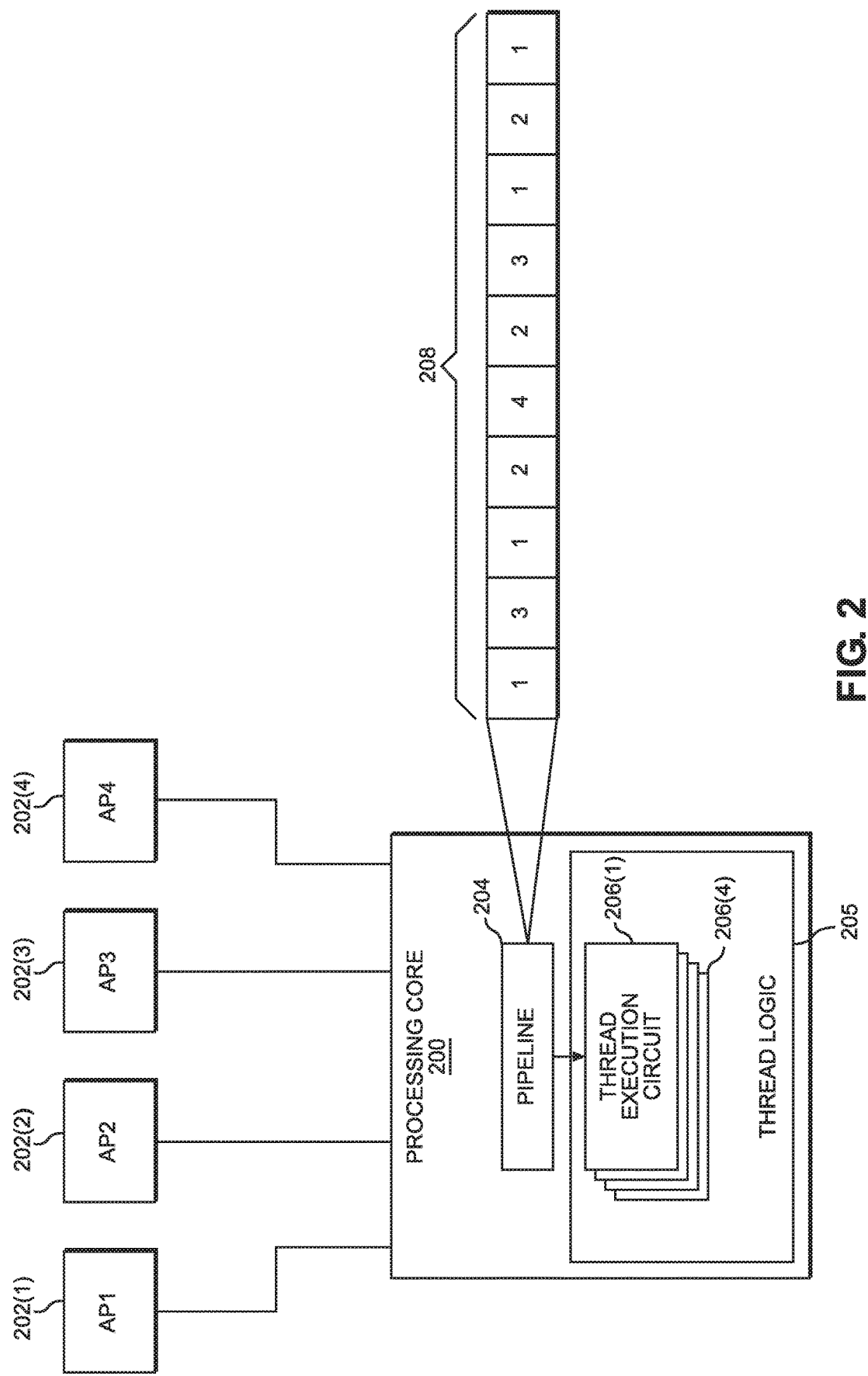
FIG. 2 is a block diagram of a processing core executing multiple threads in a processor pipeline.

Within a processor such as the processor 102, there may be multiple CPUs 104 as previously described. Each CPU 104 may be a processing core 200 that serves one or more applications as illustrated in FIG. 2. In particular, the processing core 200 may serve applications (AP) 202(1)-202(4). Each application 202(1)-202(4) generates a thread, which is passed to the processing core 200 in a pipeline 204 for action by a thread logic 205 and particularly by a respective one of the thread execution circuits 206(1)-206(4) within the thread logic 205. Note that there may be more thread execution circuits 206(1)-206(4) and there need not be a one-to-one relation between the applications 202(1)-202(4) and the thread execution circuits 206(1)-206(4). The pipeline 204 may create a multi-thread sequence 208 according to the needs of the applications 202(1)-202(4). For example, the application 202(1) may require 40% of the execution cycles of the thread logic 205 (indicated by the number 1 in the multi-thread sequence 208); the application 202(2) may require 30% of the execution cycles of the thread logic 205 (indicated by the number 2 in the multi-thread sequence 208); the application 202(3) may require 20% of the execution cycles of the thread logic 205 (indicated by the number 3 in the multi-thread sequence 208); and the application 202(4) may require 10% of the execution cycles of the thread logic 205 (indicated by the number 4 in the multi-thread sequence 208). Note that the precise order of the multi-thread sequence 208 is arbitrary, and other orders or arrangements may be used. Likewise, the percentages chosen are merely illustrative and chosen for ease of illustration. It should be appreciated that real world applications working on a processing core may vary from this example without departing from the present disclosure.

Problems may arise for a multi-threaded core such as the processing core 200 when the demands made by the applications 202(1)-202(4) cause the processing core 200 to exceed some limit. This limit may be a power limit set by a power management integrated circuit (IC) (PMIC) (e.g., a maximum current or voltage exceeded), a thermal or temperature limit, some form of low frequency power distribution network limit, or the like. Traditionally, if such a limit were exceeded, all threads would be slowed globally such as by reducing a clock frequency or a voltage level for the processing core. Such slowing may negatively impact performance. As processing cores are asked to handle increasingly complex computations or more applications simultaneously, the risk of exceeding such limits increases.

Extending the example set forth in FIG. 2, if the combined power consumed by the thread execution circuits 206(1)-206(4) exceeds a predefined threshold, which may be predefined as part of a configurable total power limit, then, in the absence of the present disclosure, there may be a global throttle on the threads. For example, if the combined power consumed is one hundred units (100 U) and the configurable total limit necessitates that only 90 U be consumed, then a global throttle would limit each thread execution circuit 206(1)-206(4) to 90% of its original power consumption level (i.e., 36-27-18-9). The 40-30-20-10 power consumption ratios between the thread execution circuits 206(1)-206(4) would be maintained, but each thread would have its performance scaled to 90% (assuming power scales linearly with performance). It should be appreciated that the configurable total power limit may be dictated by a current constraint, a battery constraint, a heat constraint, or the like.

In contrast, exemplary aspects of the present disclosure would throttle only some of the thread execution circuits 206(1)-206(4) that consume high power and not throttle any low power thread execution circuits. For example, thread execution circuits 206(1) and 206(2) may be throttled to achieve the 90 U limit. Thus, the thread execution circuit 206(1) is scaled (by throttling) first and most severely (40 U to 32 U), and the thread execution circuit 206(2) is scaled (by throttling) second and next most severely (30 U to 28 U) as both of these threads are the highest power consuming threads and are consuming more than a shared power limit. In this illustration, the other two threads are not impacted in performance at all, since both consume less than the shared power limit. As noted above, the shared power limit may be based on an average power consumed or an accumulated difference or other metric as needed or desired. So, for this scenario, the power consumption ratios are 32-28-20-10, respectively, and the system's total power is at 90 U satisfying the limit requirement of the configurable total power limit. More details are provided below as well as providing an explanation for how high priority threads may be weighted so as to avoid throttling.

Figure 3A:
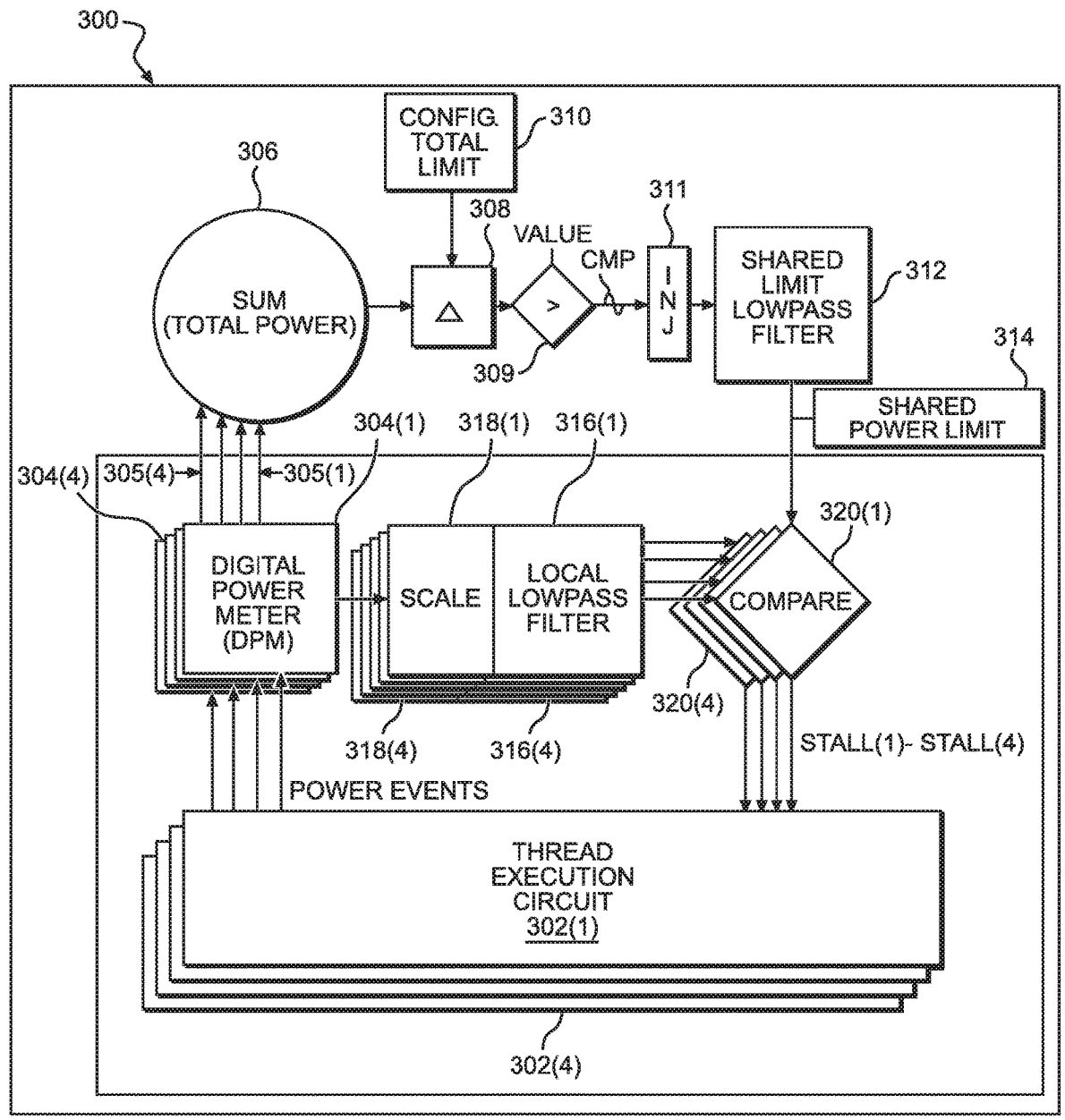
FIG. 3A is a block diagram of a processing core with multi-thread power limiting circuitry according to an exemplary aspect of the present disclosure with a delta accumulator circuit.

Thus, exemplary aspects of the present disclosure allow for power savings to be effectuated on a thread-by-thread basis by using power as a shared resource. In particular, threads in a multi-thread processing core that are consuming more than a shared power limit may be throttled when the total power consumption exceeds a power limit for the processing core while threads that consume less than the shared power limit may avoid being throttled. Additionally, the approach also accounts for scaling of power based on priority of threads such that for multiple threads consuming equal power, a thread with a higher priority task is throttled less compared to a thread with a low priority task. The result is compliance with power constraints without unnecessarily compromising on performance of low power or high priority threads In this regard, FIG. 3A illustrates a processing core 300 according to an exemplary aspect of the present disclosure. In particular, the processing core 300 may include a plurality of thread execution circuits 302(1)-302(4) which operates on a multi-thread sequence such as the multi-thread sequence 208 of FIG. 2. While four thread execution circuits 302(1)-302(4) are illustrated to be consistent with the examples set forth above, it should be appreciated that this number may be varied without departing from the scope of the present disclosure. As the thread execution circuits 302(1)-302(4) process a given thread, an event associated with that thread occurs (e.g., memory access, multiply, shift, matrix multiply, or the like) and is reported by the corresponding thread execution circuit 302(1)-302(4) to a corresponding digital power meter (DPM) 304(1)-304(4). It should be appreciated that the tracking of the power events per thread by the respective DPM is used to infer how much power a thread is actually consuming. That is, power consumed may be inferred or approximated based on how many events are counted by the DPM. It should further be appreciated that in the simplest exemplary aspect, each power event is weighted the same, regardless of whether it takes more or less power than other power events. A more sophisticated DPM may weight the power event by some value representing a relative amount of power on the scale of power events.

With continued reference to FIG. 3A, all of the per-thread DPMs 304(1)-304(4) provide a per-thread power output signal 305(1)-305(1) (which is, as noted, an approximation of the power consumed by a given thread) to a summation circuit 306, which sums the power consumed. A difference between the sum and a value provided by a configurable total limit circuit 310 is computed and accumulated in a delta accumulator circuit 308. The output of the delta accumulator circuit 308 is compared using a first comparator 309 to a zero (0) or other finite value (generically the present disclosure refers to the value used by the first comparator 309 as "a predefined limit"). An output signal (CMP) is provided to an injector circuit 311 (see also FIG. 3C). The injector circuit 311 provides a minimum value or a maximum value to a shared limit lowpass filter 312. The injector circuit 311 provides the minimum value to the shared limit lowpass filter 312 when CMP indicates that the output of the delta accumulator circuit 308 is greater than the predefined limit, and the injector circuit 311 provides the maximum value when the CMP indicates that the that the output of the delta accumulator circuit 308 is less than (or equal to) the predefined limit. Based on the value provided by the injector circuit 311, the shared limit lowpass filter 312 creates a shared power limit 314. It should be appreciated that the shared power limit is a dynamically computed value such that the configurable total power limit (imposed by, for example, a battery constraint, a current constraint, a heat constraint, or the like) is not exceeded by the average of total power across all threads (as opposed to an average thread power). Thus, the shared power limit may increase when the average of the total power is below the configurable total power limit and decrease when the average of the total power is above the configurable total power limit. In the running example, the total power limit is 90 U. While the shared power limit is used to make sure that the configurable total power limit is not exceeded, the shared power limit is a "thread-level" value and not a total power value. That is, the shared power limit is compared to a given thread's power level to see if that thread's power consumption exceeds the shared power limit, and if so, that thread is stalled as explained in greater detail below.

As discussed below with reference to FIG. 3B, there are other ways of generating a shared power limit.

In addition to providing the power output signals 305(1)-305(4) to the summation circuit 306, each of the DPMs 304(1)-304(4) may also provide an identical output to a respective one of a plurality of local lowpass filters 316(1)-316(4). Each local lowpass filter 316(1)-316(4) may optionally include a respective weight or scale factor 318(1)-318(4) (sometimes referred to as a scaling circuit) based on a priority of the thread. Each respective output of the local lowpass filter 316(*l*)-316(4) is compared using a respective second comparator 320(1)-320(4) to the shared power limit 314, and, if the value of the output of a given local lowpass filters 316(1)-316(4) is greater than the shared power limit 314, then the corresponding thread is stalled in the respective thread execution circuit 302(1)-302(4) via stall signals stall(1)-stall(4). The scale factors provided by the scaling circuits 318(1)-318(4) allow adjustments based on thread priorities for the shared power resource. In essence, the scale factors may make a particular thread look like it is using less power than it actually is using so that that thread is given preferential treatment at the comparison step.

Figure 3B:
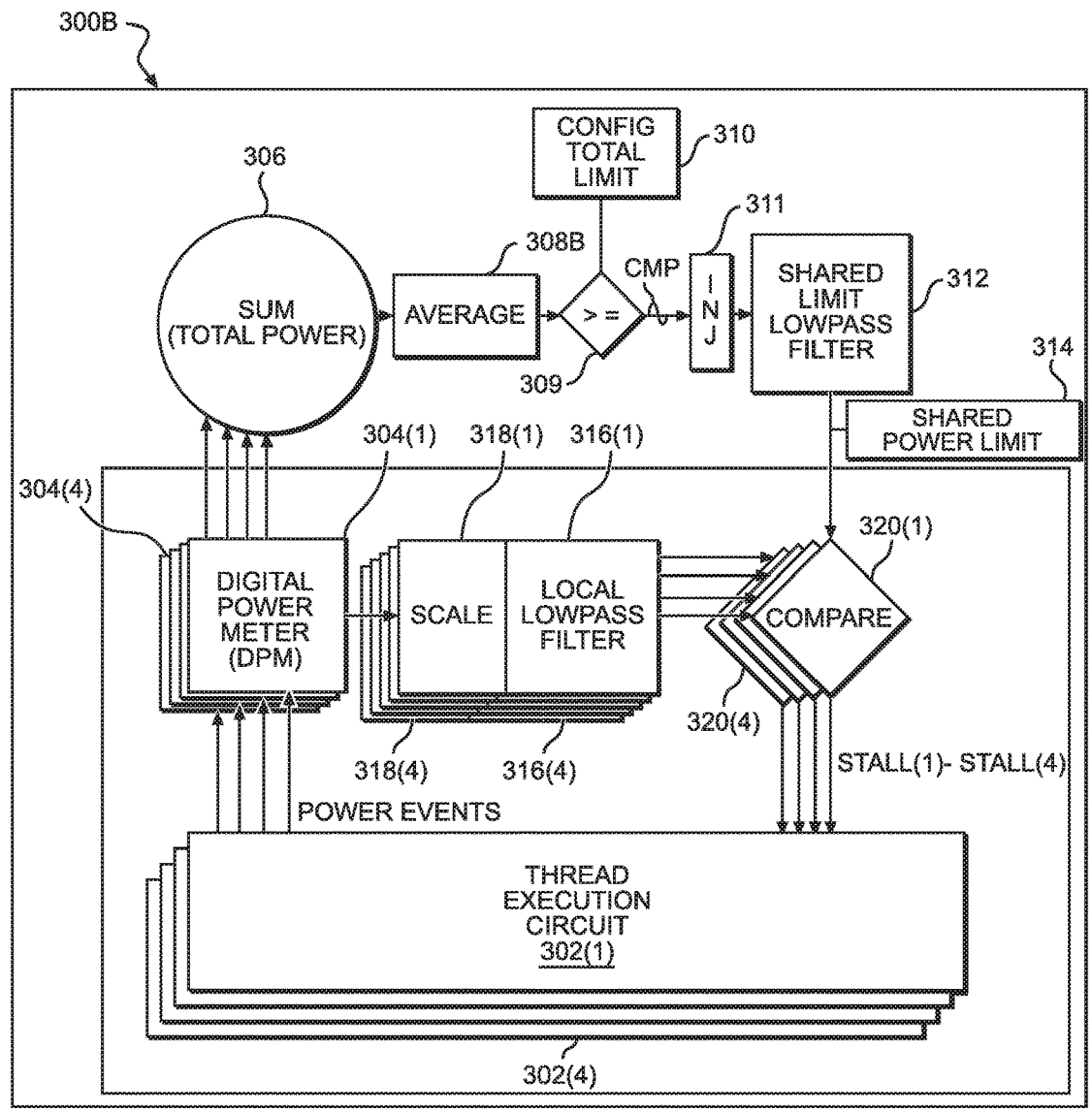
FIG. 3B is a block diagram of a processing core with multi-thread power limiting circuitry according to an exemplary aspect of the present disclosure, with an averaging circuit.

An alternate exemplary aspect is provided in FIG. 3B. Structurally, the processing core 300B is nearly identical to the processing core 300 of FIG. 3A. However, instead of a delta accumulator circuit 308, the processing core 300B has an averaging circuit 308B that finds an average power consumed by threads from the summed power consumption. The averaging circuit 308B may be a lowpass filter, although other circuits could be used equivalently. As used herein, the averaging circuit 308B is determining an average power over time per thread. The average power consumed by a thread is compared at the first comparator 309 to a value provided by the configurable total limit circuit 310 (this value is also included in the generic appellation "predefined limit") to generate the CMP signal for the injector circuit 311. It is possible that for this comparison, the value from the averaging circuit 308B is greater than or equal to the predefined limit.

Figure 3C:
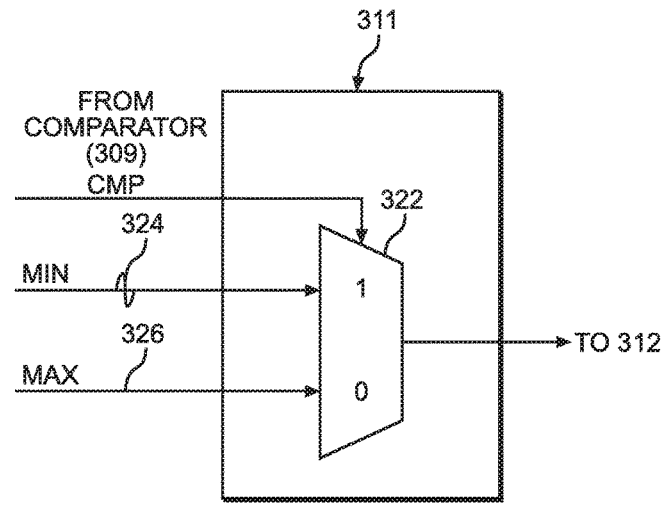
FIG. 3C is a block diagram of an injector used in the circuitry of FIGS. 3A and 3B.

FIG. 3C illustrates the injector circuit 311. In particular, the injector circuit 311 includes a multiplexor 322 that receives a minimum value 324 and a maximum value 326. Based on the CMP from the first comparator 309, the multiplexor 322 outputs one of the minimum value 324 (the CMP indicates the output of the delta accumulator circuit 308 is greater than the predefined limit or the averaging circuit 308B is greater than or equal to the predefined limit (whether that be 0, a finite value, or a value from the configurable total limit circuit 310)) or the maximum value 326 (the CMP indicates the output of the delta accumulator circuit 308 or the averaging circuit 308B is less than the predefined limit) to the shared limit lowpass filter 312.

As a point of nomenclature, a "manipulation circuit" is defined to include the delta accumulator circuit 308 and the averaging circuit 308B.

While the processing core 300 and the processing core 300B illustrate two possible implementations, some of the advantages of the present disclosure may also be achieved by dividing the sum of the power (e.g., as generated by summation circuit 306 by the number of threads to get an average thread power. If the total power from the summation circuit 306 exceeds a threshold, then threads consuming power in excess of the average thread power may be throttled. Again, threads generated by applications having a high priority may be weighted so that they are less likely to be throttled or are not throttled to the same degree that unweighted threads are throttled. Instead of generating throttles per thread based on whether the total power exceeds a threshold, threads consuming power by a predefined margin (e.g., ten percent) above the average thread power may be throttled.

Figure 4A:
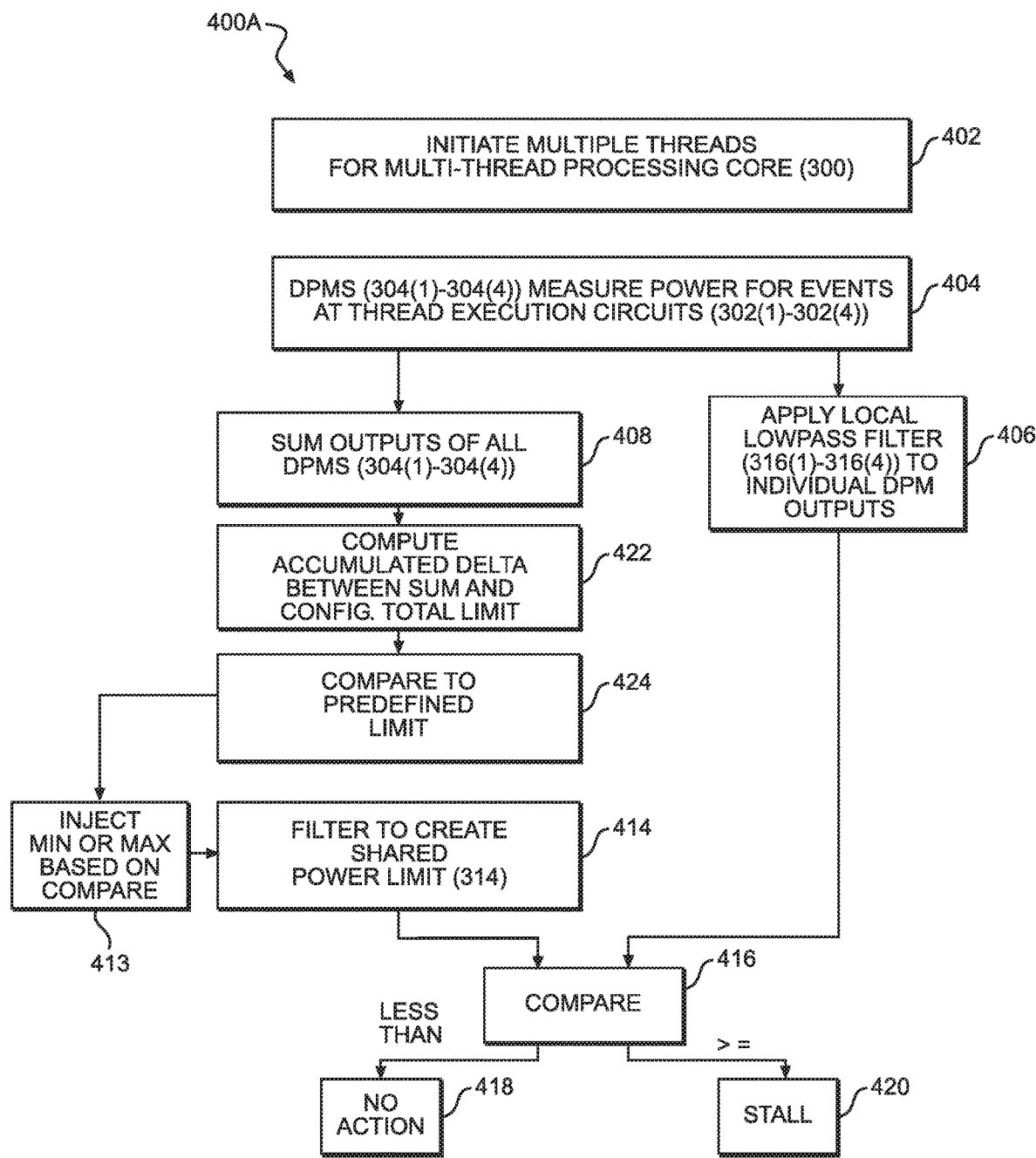
FIG. 4A is a flowchart illustrating an exemplary process for throttling a multi-threaded processing core to limit power with minimal impact on performance.

An exemplary aspect of the multi-thread power limiting process according to the present disclosure is illustrated as process 400A in FIG. 4A. The process 400A corresponds to the processing core 300 of FIG. 3A and starts with initiation of multiple threads for the multi-thread processing core 300 (block 402). For each thread, a respective DPM 304(1)-304(4) measures power for events at the thread execution circuits 302(1)-302(4) (block 404) as reported by the thread execution circuits 302(1)-302(4). For each DPM 304(1)-304(4), a local lowpass filter 316(1)-316(4) is applied to the DPM individual output (block 406). Optionally, this local lowpass filter's inputs may be weighted by the scaling circuits 318(1)-318(4).

Concurrently, the outputs of all the DPMs 304(1)-304(4) are summed (block 408). The process 400A continues by computing the accumulated delta (e.g., a difference) between the sum and the configurable total limit (block 422) and compares this difference to the predefined limit (block 424).

The minimum value 324 or the maximum value 326 is injected based on the CMP from the first comparator 309 (block 413). The output of the injector circuit 311 is filtered to create a shared power limit 314 (block 414).

The shared power limit 314 is compared to the individual filtered DPM outputs (block 416) and, if the individual filtered DPM output is less than the shared power limit 314, no action is taken (block 418). This comparison is sometimes referred to as comparing a value associated with power consumed by an individual thread in that the comparison may be to the true value of the DPM output or may be to a scaled value of the DPM output. Otherwise, if the individual filtered DPM output is greater than or equal to the shared power limit 314, the thread is stalled (block 420). As noted, the individual DPM outputs may optionally be scaled to reflect priorities as desired.

Figure 4B:
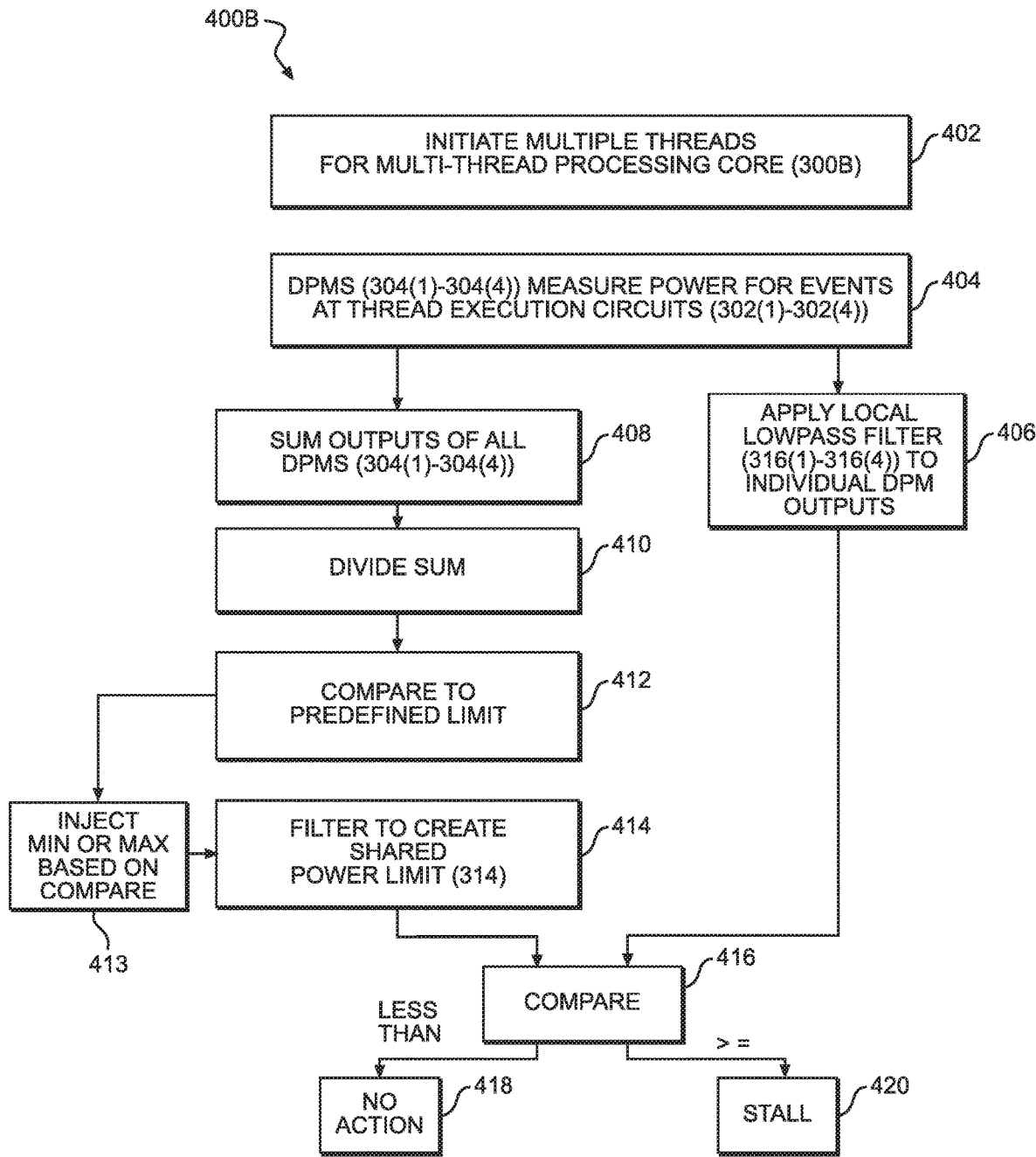
FIG. 4B is a flowchart illustrating an alternate exemplary process for throttling a multi-threaded processing core to limit power with minimal impact on performance.

An alternate process 400B is provided in FIG. 4B. The process 400B corresponds to the processing core 300B of FIG. 3B and, in most regards, the process 400B is identical to the process 400A described above. However, after block 408, the sum is divided (block 410) by the averaging circuit 308B to determine an average thread power, and this average thread power is compared to a predefined limit (block 412) as provided by the configurable total limit circuit 310. As noted, the remainder of the process 400B is identical to the process 400A of FIG. 4A.

Note that the present disclosure is not limited to just a single multi-core processor. The same concepts can be applied across multiple cores such that if a single core's average power is consuming more than the shared power limit that core may be throttled. Still further, this may be applied to multiple ICs, where if a single IC in a plurality of ICs is consuming more than the shared power limit, that IC may be throttled.

Figure 5:
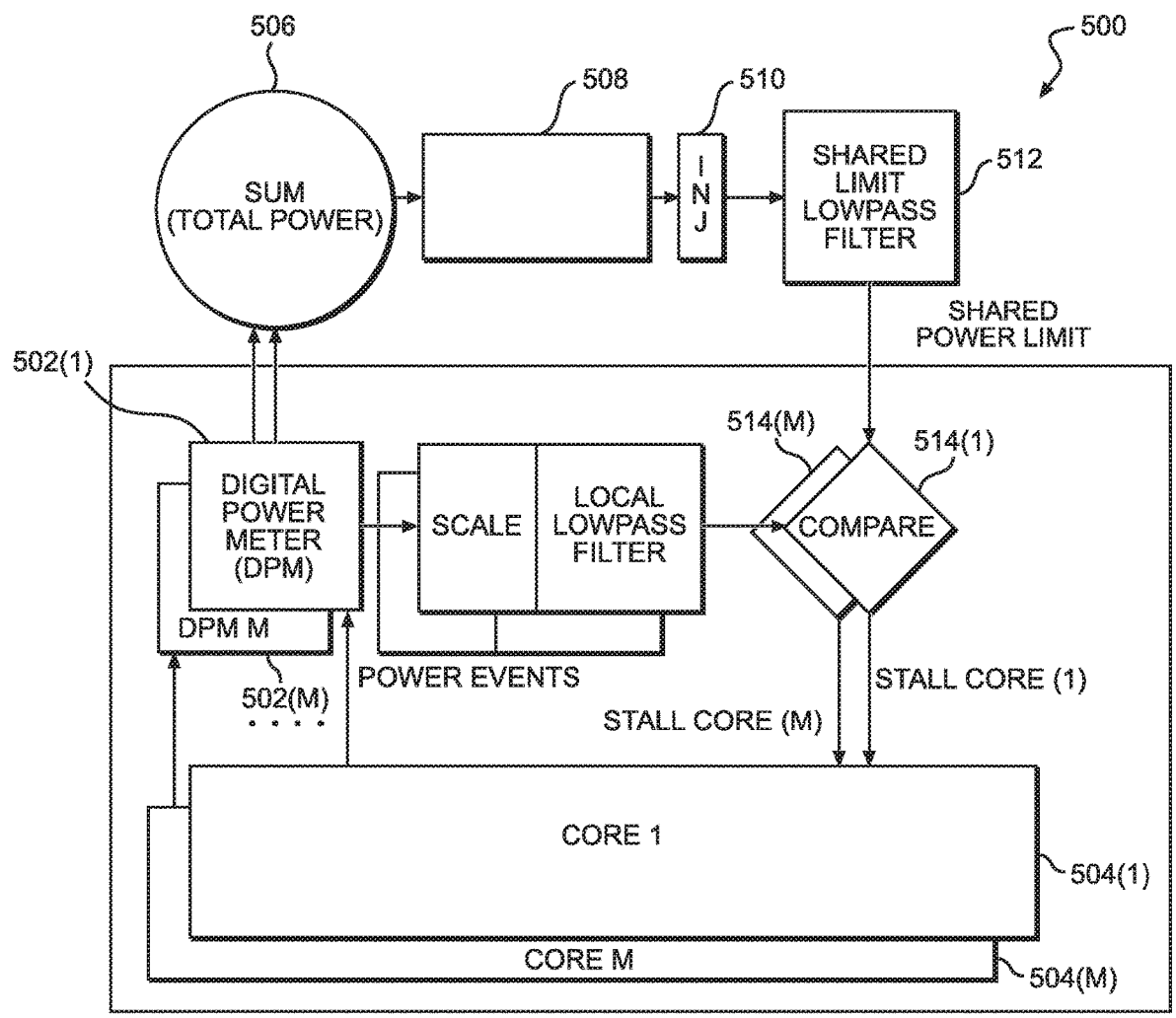
FIG. 5 is a block diagram of exemplary aspects of the throttling of the present disclosure applied at a processor or processing core level in a multiple processing core system.

A block diagram of an exemplary multi-core aspect is illustrated in FIG. 5. IC 500 is similar to the processing core 300, but instead of multiple thread execution circuits, DPMs 502(1)-502(M) are coupled to separate processing cores 504(1)-504(M). In other regards, the process is essentially the same with the output of the DPMs 502(1)-502(M) being summed by a summation circuit 506, and then provided to some version of an averaging or delta accumulator and a compare circuit 508 (which can be analogous to either of the implementations in FIG. 3A or 3B). The output of the averaging or delta accumulator and compare circuit 508 may be provided to an injector circuit 510, which is then filtered in a shared limit lowpass filter 512 before being provided as a shared power limit to comparators 514(1)-514(M) to stall the processing cores 504(1)-504(M).

Figure 6:
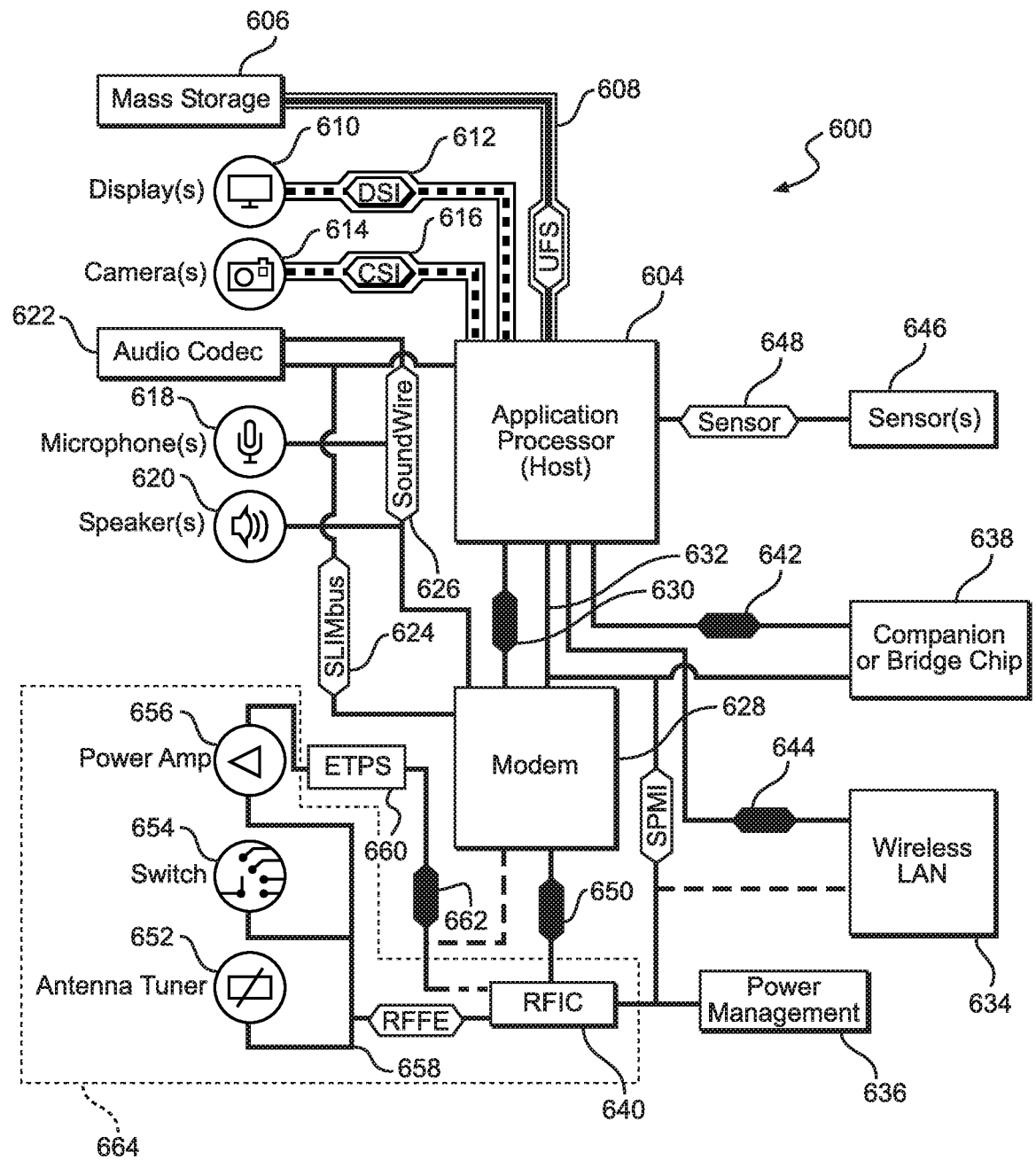
FIG. 6 is a block diagram of an exemplary processor-based mobile terminal that can include the multi-thread power limiting circuitry of FIG. 3A or 3B.

While exemplary aspects of the present disclosure are contemplated for desktop computers or servers, the disclosure is not so limited and may be used in a mobile computing device. An exemplary mobile computing device is illustrated in FIG. 6. In this regard, FIG. 6 is a system-level block diagram of an exemplary mobile terminal 600 such as a smart phone, mobile computing device tablet, or the like.

With continued reference to FIG. 6, the mobile terminal 600 includes an application processor 604 (sometimes referred to as a host) that communicates with a mass storage element 606 through a universal flash storage (UFS) bus 608. The application processor 604 may have one or more multi-thread processing cores that may benefit from the present disclosure. The application processor 604 may further be connected to a display 610 through a display serial interface (DSI) bus 612 and a camera 614 through a camera serial interface (CSI) bus 616. Various audio elements such as a microphone 618, a speaker 620, and an audio codec 622 may be coupled to the application processor 604 through a serial low-power interchip multimedia bus (SLIMbus) 624. Additionally, the audio elements may communicate with each other through a SOUNDWIRE bus 626. A modem 628 may also be coupled to the SLIMbus 624 and/or the SOUNDWIRE bus 626. The modem 628 may also have one or more multi-thread processing cores that may benefit from the present disclosure. The modem 628 may further be connected to the application processor 604 through a peripheral component interconnect (PCI) or PCI express (PCIe) bus 630 and/or a system power management interface (SPMI) bus 632.

With continued reference to FIG. 6, the SPMI bus 632 may also be coupled to a local area network (LAN or WLAN) IC (LAN IC or WLAN IC) 634, a power management integrated circuit (PMIC) 636, a companion IC (sometimes referred to as a bridge chip) 638, and a radio frequency IC (RFIC) 640. It should be appreciated that separate PCI buses 642 and 644 may also couple the application processor 604 to the companion IC 638 and the WLAN IC 634. The application processor 604 may further be connected to sensors 646 through a sensor bus 648. The modem 628 and the RFIC 640 may communicate using a bus 650.

With continued reference to FIG. 6, the RFIC 640 may couple to one or more RFFE elements, such as an antenna tuner 652, a switch 654, and a power amplifier 656 through a radio frequency front end (RFFE) bus 658. Additionally, the RFIC 640 may couple to an envelope tracking power supply (ETPS) 660 through a bus 662, and the ETPS 660 may communicate with the power amplifier 656. Collectively, the RFFE elements, including the RFIC 640, may be considered an RFFE system 664. It should be appreciated that the RFFE bus 658 may be formed from a clock line and a data line (not illustrated).

In the interests of completeness, additional details are provided for various elements within the processing cores 300 and 300B. It should be appreciated that these details are not central to the present disclosure and are provided by way of example for the interested reader to understand one way these elements may be implemented. Other circuitry may achieve the same functions without departing from the present disclosure.

Figure 7:
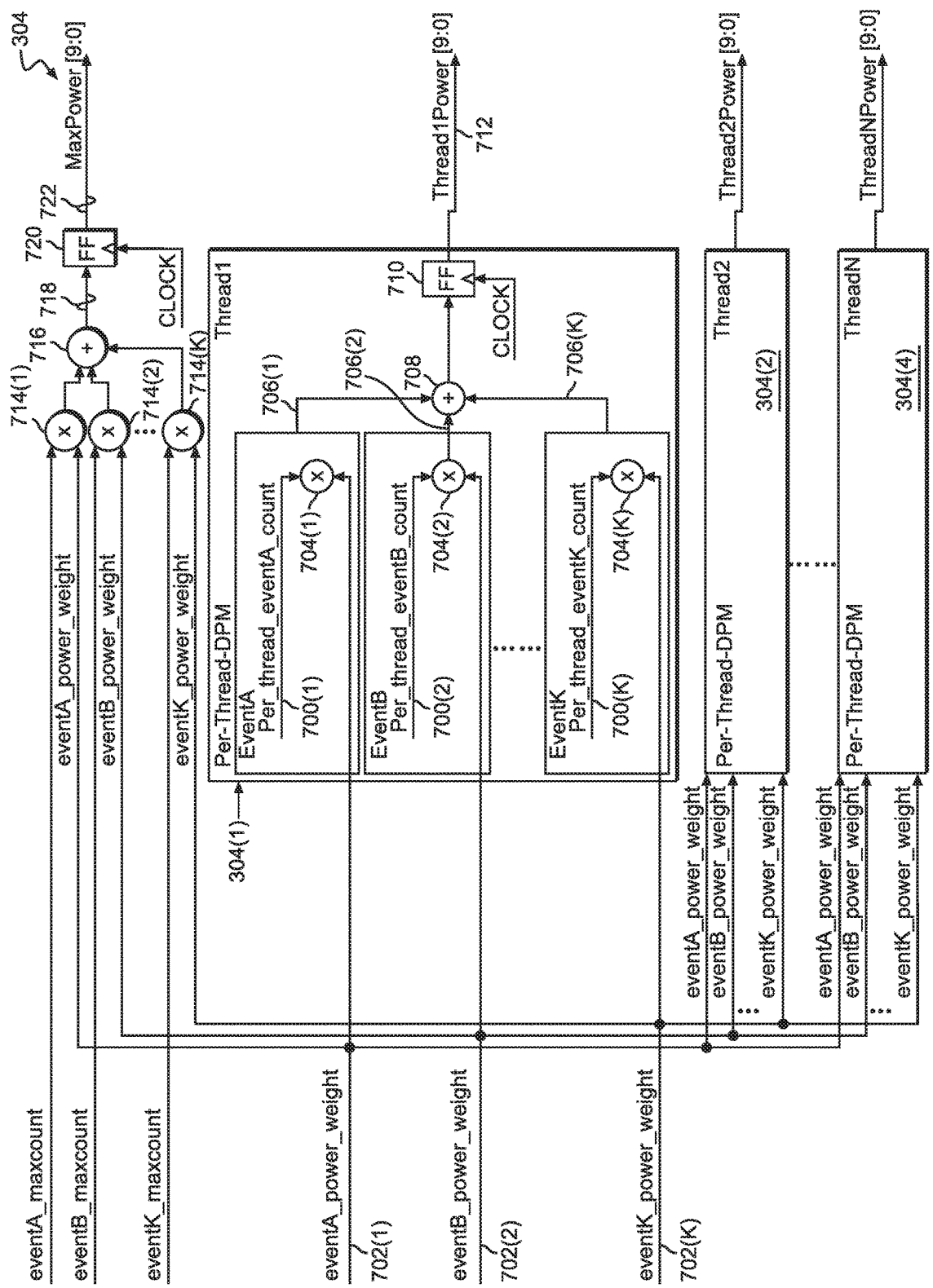
FIG. 7 is a block diagram of the per-thread digital power meter (DPM) of FIGS. 3A and 3B.

FIG. 7 illustrates a schematic diagram of the DPM 304(1) with simplified blocks for the remaining DPMs 304(2)-304(N). While as previously illustrated N=4, it should be appreciated that more or fewer DPMs 304 may be present based on the processing core structure. The DPM 304(1) receives a per_thread_event[type]_count input 700(1)-700(K) as well as an event[type]_power_weight input 702(1)-702(K). The corresponding count is multiplied by the corresponding weight by multipliers 704(1)-704(K). The resulting outputs 706(1)-706(K) are summed by a summation circuit 708 and clocked by a flip flop 710 to provide a thread power output 712. The flip flop 710 synchronizes values and sends the output to the main control circuit as the thread power output 712. FIG. 7 also shows the maxpower calculation, where each event[type] has an event[type]_maxcount, which is multiplied by the corresponding event[type]_power_weight input 702(1)-702(K) in respective multipliers 714(1)-714(K), and summed by a summation circuit 716. The output 718 of the summation circuit 716 is clocked by a flip flop 720 to provide a maxpower output 722. Maxcount can be a constant specified by design. Maxcount may be determined based on microarchitectural knowledge of a theoretical maximum possible count during processor execution accounting for events that cannot happen in the same cycle of each of the selected events. In other words, it may be a sum of events that can occur across all resources (an upper bound). Alternatively, it may be a conservative value which not only assumes a worst case (the upper bound) but adds in a safety margin. The maxpower output 722 is one of the components used to compute the configurable total limit. This computation is done so that the comparison of the total power (power per thread and total power) is in the same scale as the maxpower units. The other component of the configurable total limit is virus_budget and any limits data.

FIG. 8A provides a more detailed schematic view of the delta accumulator circuit 308 of FIG. 3A. It should be appreciated that this is intended to be an exemplary circuit and other circuits may be used without departing from the present disclosure. In particular, a total power input vector 800 generated in the summation circuit 306 is clocked by a flip flop 802 before being provided to a subtractor 804. The output of the subtractor 804 is provided to a summation circuit 806. The output of the summation circuit 806 is clocked by a flip flop 808. The output of the flip flop 808 is a deficit vector 810, which is used by the summation circuit 806. The deficit vector 810 is also used by the first comparator 309 to determine an over global limit 812. The subtractor 804 also receives a global budget vector 814.

FIG. 8B provides a more detailed schematic view of the averaging circuit 308B of FIG. 3B. It should be appreciated that this is intended to be an exemplary circuit and other circuits may be used without departing from the present disclosure. In particular, the total power input vector 800 generated in the summation circuit 306 is clocked by a flip flop 816 before forming an input vector TotalPowerP1 818, which is provided to a first order infinite impulse response (IIR) lowpass filter 820 described in more detail below with reference to FIG. 9. The first order IIR lowpass filter 820 outputs an average power vector 822 to the first comparator 309. The average power vector 822 is compared to a global budget vector 824 to determine the over global limit 812. The global budget vector 824 is the output of the configurable total limit. The over global limit 812 acts as the CMP signal in FIGS. 3B and 3C. When the over global limit 812 is one (1), the MIN is selected through the injection circuit 311. Similarly, when the over global limit 812 is zero (0), the MAX is selected through the injection circuit 311. The MIN and MAX values are inputs for the shared limit lowpass filter 312. The over global limit 812, injection circuit 311, and shared limit lowpass filter 312 result in a process which makes the shared power limit a dynamically adjusted value thus making the shared power limit an adaptive shared limit.

FIG. 8C provides a simplified schematic for a summation circuit 826 that calculates the total power input vector 800 used by the circuits 308, 308B. Thread[1-N]Power vectors are provided by the DPMs 304(1)-304(N).

Figure 9:
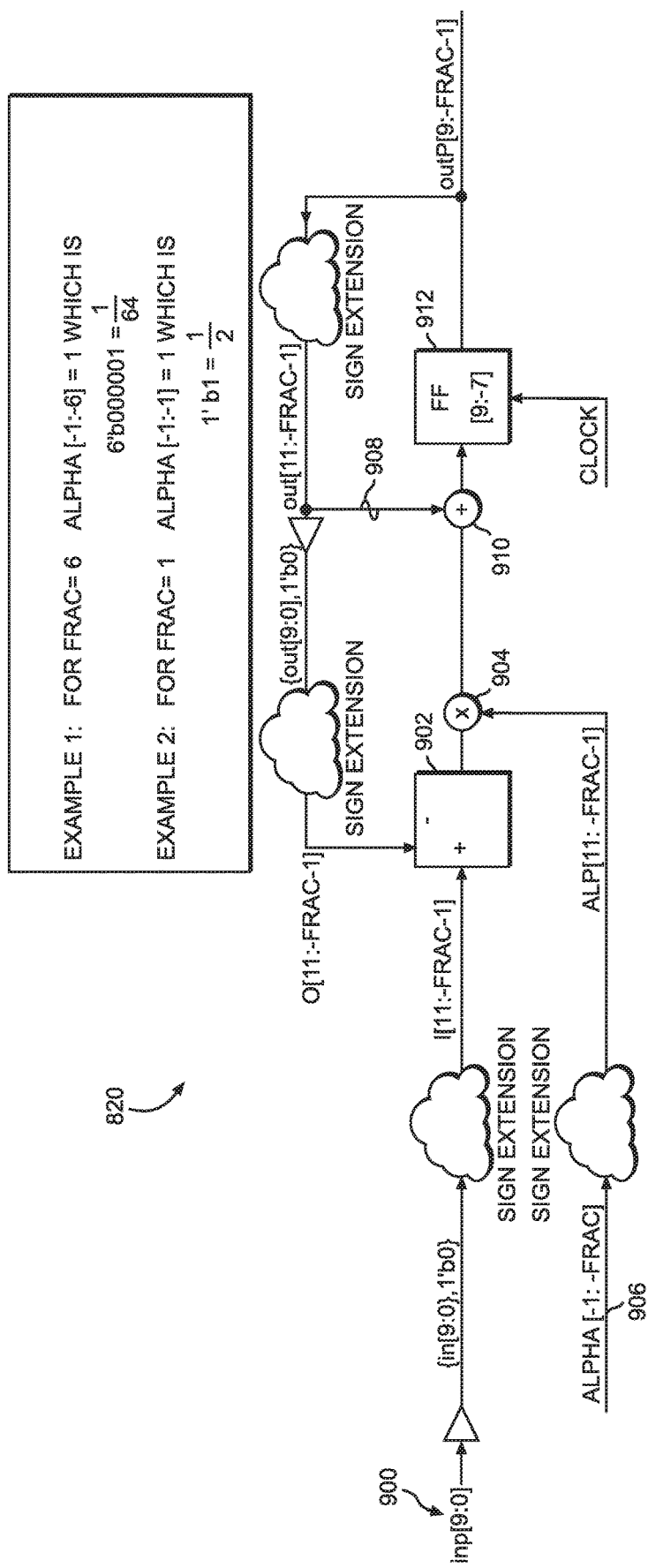
FIG. 9 is a schematic diagram of a first order infinite impulse response (IIR) lowpass filter that may be used by the circuit of FIG. 8B or in other locations within the present disclosure.

FIG. 9 is a schematic diagram of the first order IIR lowpass filter 820. An input vector 900 is provided to a subtractor 902 whose output is multiplied by a multiplier 904 with an alpha vector 906. The output of the multiplier 904 is summed with a feedback signal 908 by a summation circuit 910. The output of the summation circuit 910 is clocked by a flip flop 912, which generates the feedback signal 908, which is also subtracted from the input vector 900 by the subtractor 902.

Figure 10:
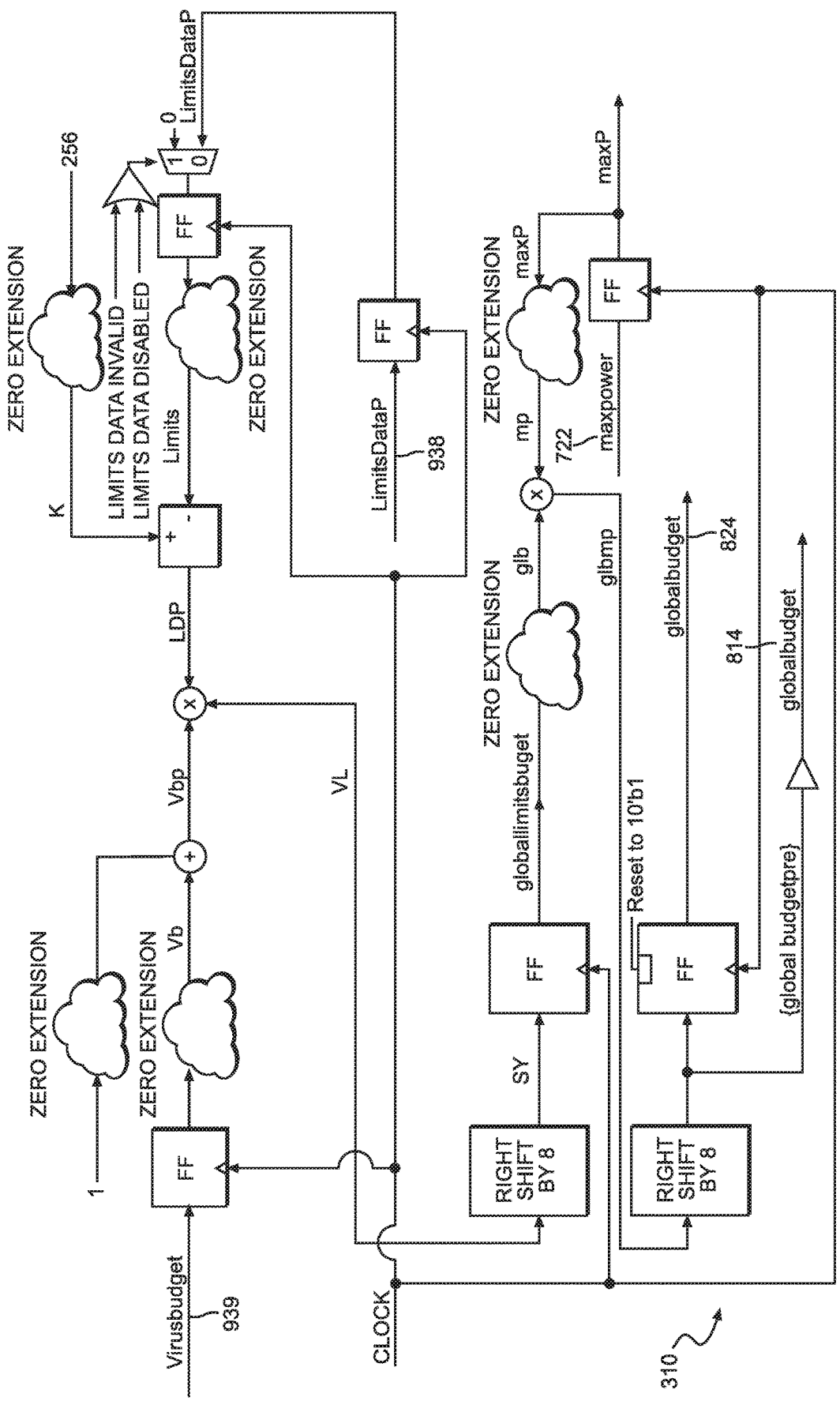
FIG. 10 is a circuit diagram showing an exemplary implementation of the configurable total limit circuitry of FIGS. 3A and 3B.

FIG. 10 is a schematic diagram of the configurable total limit circuit 310 used to generate a configurable total limit from a limits data vector 938, a virus budget vector 939, and the maxpower output 722 to generate a the global budget vector 932. The limits data vector 938 may be increased or decreased to reflect a longer loop for configuration data at the processor. The virus budget may also be called a virus mitigation field and may be configured to limit an internal loop that is much faster than the outer loop formed by the limits data vector 938. For example, the total power can be capped based on a power-virus mitigation field as a fractional value of maximum power. That is, the configurable total limit is a function (maxpower, virus budget, limits data). So, if the limits data is a 0, then the configurable total limit becomes a function (maxpower, virus budget).

Figure 11:
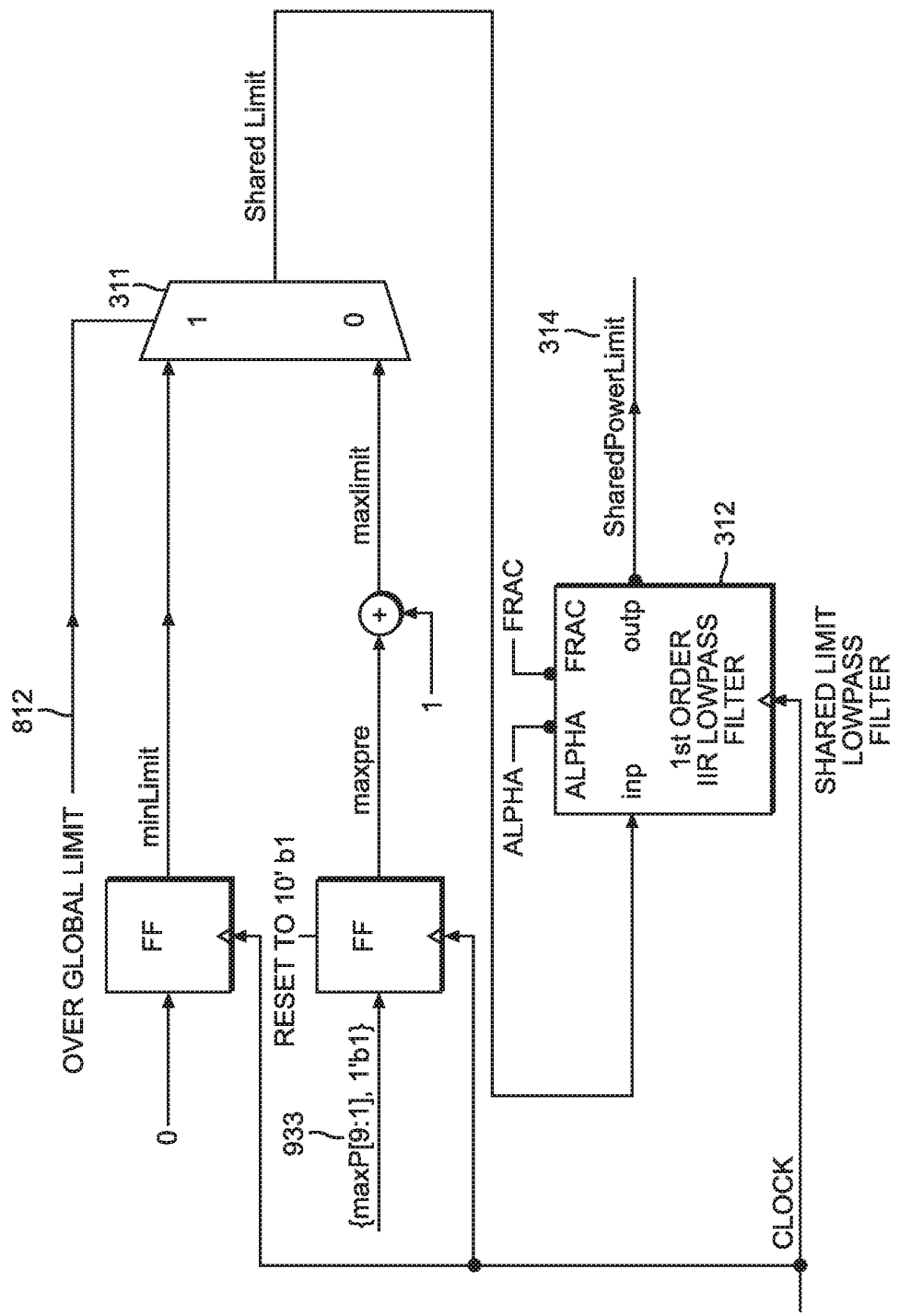
FIG. 11 is a circuit diagram showing an exemplary implementation of the injector of FIGS. 3A and 3B using a multiplexor and a shared power limit generator through a shared limit lowpass filter.

FIG. 11 is a schematic diagram of the shared limit lowpass filter 312 that outputs the shared power limit 314, using a maxP vector 933 and the injector circuit 311 of FIGS. 3A and 3B whose select is the over global limit 812.

Figure 12:
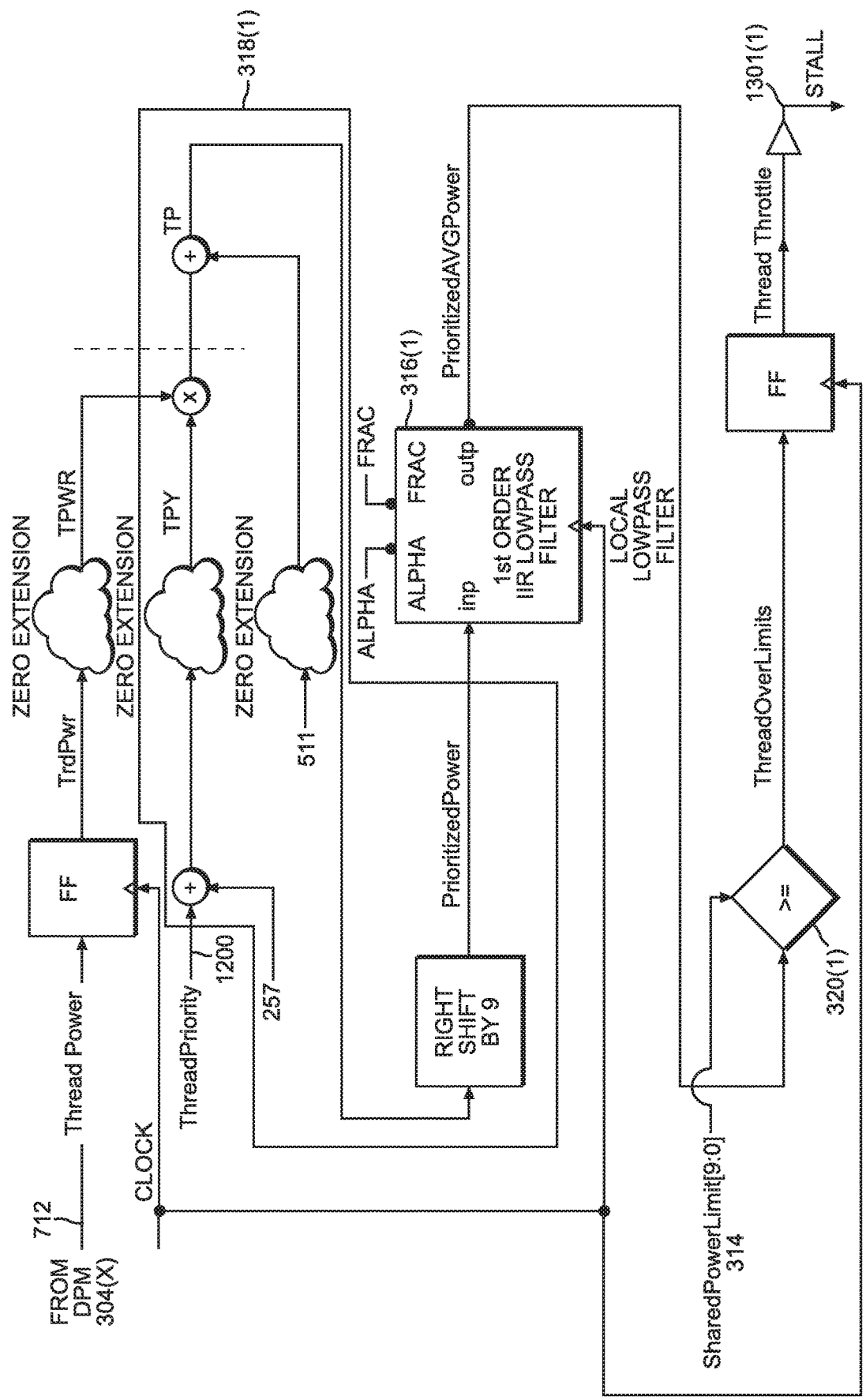
FIG. 12 is a circuit diagram showing an exemplary implementation of the outputs from the per-thread DPM of FIGS. 3A and 3B, scaled power using per-thread priority followed by a second comparator that uses a shared power limit generator output to generate the per-thread throttle or per-thread stall to the processing core.

FIG. 12 is a schematic diagram showing the path of the output from a DPM 304(X) (from amongst the plurality of DPMs 304(1)-304(N)) (i.e., thread power output 712) into the comparator 320. The thread power vector 712 is scaled using a ThreadPriority vector 1200, and provided to the second comparator 320(1) that uses a shared power limit 314 generator output versus an output of the local lowpass filter 316(1), to generate a per-thread throttle or per-thread stall 1301(1) to the processing core through the second comparator 320(1) of FIGS. 3A and 3B. Values such as 257 and 511 are provided to assist in rounding as noted in FIG. 12.

Figure 13:
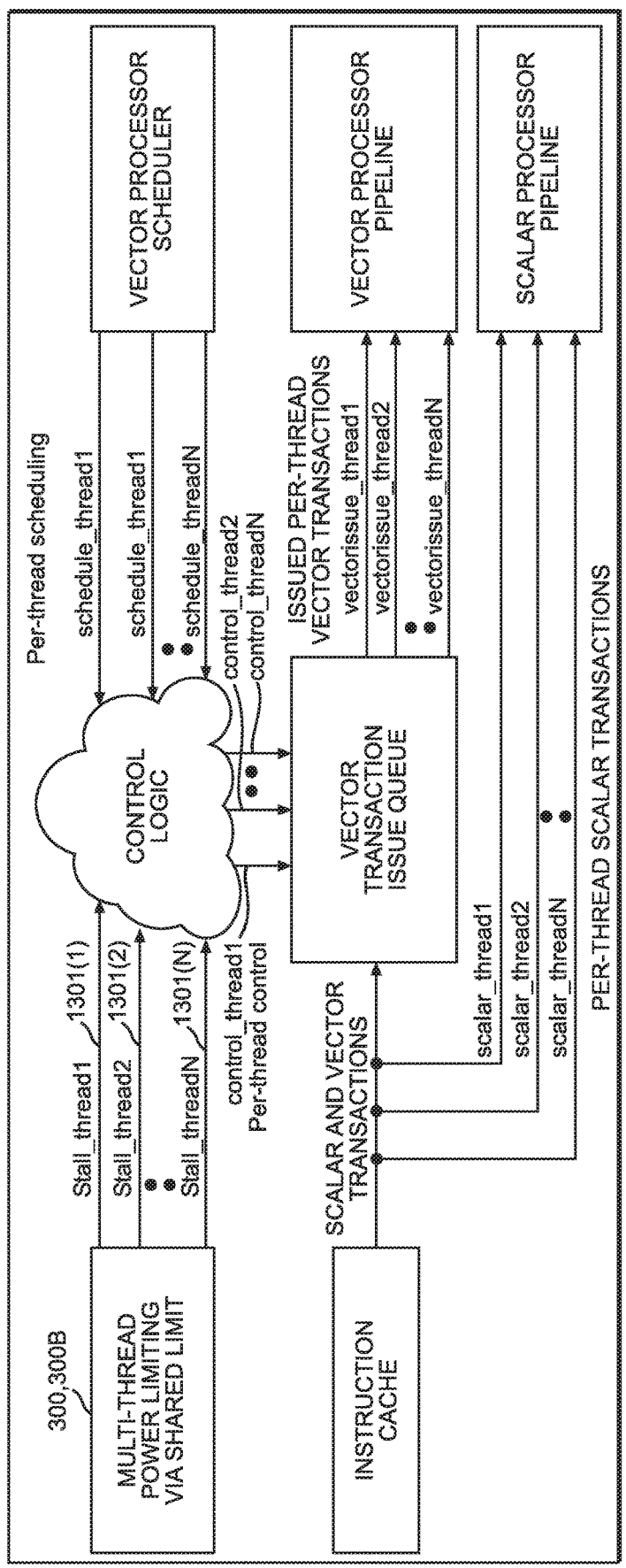
FIG. 13 is a block diagram illustrating how the per-thread stall controls the per-thread issue of transactions in the processor pipeline.

FIG. 13 describes an illustration of how in processing core 300, 300B the per-thread stall controls the per-thread issue of transactions in a processor pipeline. In FIG. 13, the processing core consists of an instruction cache (I-cache) that issues scalar transactions and vector transactions to a scalar pipeline and vector pipeline, respectively. Since vector transactions (instruction packets) are significantly higher power than scalar transactions, this exemplary mechanism generates per-thread stalls (stall_thread1, stall_thread2 . . . stall_threadN) 1301(1-N) to a control logic which, in combination with per-thread scheduling (schedule_thread1, schedule_thread2, . . . schedule-threadN) from a vector processor scheduler, may provide per-thread controls (control_thread1, control_thread2 . . . control_threadN) to a vector-transaction issue queue. With the vector-transaction issue queue receiving transactions from the I-cache, this impacts the per-thread vector transaction issue rate to the vector processor pipeline. When this exemplary mechanism asserts any of stall_thread1, stall_thread2 . . . stall_threadN 1301(1-N) the vector transactions for that thread (vectorissue_thread1, vectorissue_thread2 . . . vectorissue_threadN) are prevented from issuing out of the vector-transaction issue queue. This eventually stalls the processor's scalar pipeline as a result of incoming vector transactions filling up the vector-transaction issue queue thus reducing power.

The systems and methods for multi-thread power limiting via a shared limit according to aspects disclosed herein may be provided in or integrated into any processor-based device. Examples, without limitation, include a set top box, an entertainment unit, a navigation device, a communications device, a fixed location data unit, a mobile location data unit, a global positioning system (GPS) device, a mobile phone, a cellular phone, a smart phone, a session initiation protocol (SIP) phone, a tablet, a phablet, a server, a computer, a portable computer, a mobile computing device, a wearable computing device (e.g., a smart watch, a health or fitness tracker, eyewear, etc.), a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, an automobile, a vehicle component, avionics systems, a drone, and a multicopter.

Those of skill in the art will further appreciate that the various illustrative logical blocks, modules, circuits, and algorithms described in connection with the aspects disclosed herein may be implemented as electronic hardware, instructions stored in memory or in another computer readable medium and executed by a processor or other processing device, or combinations of both. The devices described herein may be employed in any circuit, hardware component, IC, or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), a compute DSP (cDSP), an artificial intelligence (AI) processor or machine learning (ML) processor, a server processor, an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices a combination of a DSP and a microprocessor, a plurality of microprocessors, one or more microprocessors in conjunction with a DSP core, or any other such configuration).

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the genetic principles defined herein may be applied to other variations. Thus, the disclosure is not intended to be limited to the examples and designs described herein, but is to be accorded the widest scope consistent with the principles and novel features disclosed herein.

What is claimed is:

1. An integrated circuit (IC) comprising:
   a multi-thread processing core comprising:
      a thread logic;
      a plurality of digital power meters configured to measure power on a thread-by-thread basis at the thread logic;
      a summation circuit configured to sum outputs from the plurality of digital power meters;
      a first comparator configured to compare an output of the summation circuit to a predefined limit; and a second comparator configured to compare an output of a digital power meter of the plurality of digital power meters to a shared power limit derived from an output of the first comparator.

2. The IC of claim 1 integrated into a mobile terminal or a server.

3. The IC of claim 1 integrated into a computing device.

4. The IC of claim 1, further comprising a scaling circuit configured to scale the outputs of the plurality of digital power meters.

5. The IC of claim 4, wherein the scaling circuit provides a scaling value based on a thread priority.

6. The IC of claim 1, further comprising a configurable total limit circuit associated with the output of the summation circuit.

7. The IC of claim 6, wherein the predefined limit is provided by the configurable total limit circuit.

8. The IC of claim 6, wherein the configurable total limit circuit is coupled to a delta accumulator circuit operating on the output of the summation circuit.

9. The IC of claim 1, wherein the predefined limit is a finite value.

10. The IC of claim 1, further comprising a delta accumulator circuit operating on the output of the summation circuit.

11. The IC of claim 1, further comprising an averaging circuit operating on the output of the summation circuit.

12. The IC of claim 11, wherein the averaging circuit comprises an infinite impulse response (IIR) filter.

13. The IC of claim 1, further comprising an injector circuit coupled to the first comparator.

14. The IC of claim 1, wherein the second comparator comprises a plurality of comparators used on respective threads.

15. The IC of claim 1 integrated into a device selected from the group consisting of: a set top box; an entertainment unit; a navigation device; a communications device; a fixed location data unit; a mobile location data unit; a global positioning system (GPS) device; a mobile phone; a cellular phone; a smart phone; a session initiation protocol (SIP) phone; a tablet; a phablet; a server; a computer; a portable computer; a mobile computing device; a wearable computing device; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; a vehicle component; avionics systems; a drone; and a multicopter.

16. An integrated circuit (IC) comprising:
a multi-thread processing core comprising:
a plurality of thread execution circuits;
a plurality of digital power meters configured to measure power on a thread-by-thread basis at a corresponding thread execution circuit;
a summation circuit configured to sum outputs from the plurality of digital power meters;
a manipulation circuit configured to operate on the sum;
a first comparator configured to compare an output of the manipulation circuit to a predefined limit;
a multiplexor configured to use the compare result from the first comparator to select a minimum limit or a maximum limit;
a circuit that uses a multiplexor output to generate a shared power limit; and
a second comparator configured to compare an output of a digital power meter of the plurality of digital power meters to the shared power limit.

17. The IC of claim 16, further comprising an injector circuit coupled to the first comparator.

18. The IC of claim 16, wherein the manipulation circuit comprises one of an averaging circuit or a delta accumulator circuit.

19. The IC of claim 17 integrated into a device selected from the group consisting of: a set top box; an entertainment unit; a navigation device; a communications device; a fixed location data unit; a mobile location data unit; a global positioning system (GPS) device; a mobile phone; a cellular phone; a smart phone; a session initiation protocol (SIP) phone; a tablet; a phablet; a server; a computer; a portable computer; a mobile computing device; a wearable computing device; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; a vehicle component; avionics systems; a drone; and a multicopter.

* * * * *